(12) United States Patent
Fork

(10) Patent No.: US 11,568,299 B1
(45) Date of Patent: Jan. 31, 2023

(54) SPINEL SUPERCONDUCTING TUNNEL JUNCTION FOR QUANTUM DEVICES

(71) Applicant: Google LLC, Mountain View, CA (US)

(72) Inventor: David Kirtland Fork, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 199 days.

(21) Appl. No.: 16/927,212

(22) Filed: Jul. 13, 2020

(51) Int. Cl.
*H01L 27/18* (2006.01)
*H01L 39/04* (2006.01)
*G06N 10/00* (2022.01)

(52) U.S. Cl.
CPC .......... *G06N 10/00* (2019.01); *H01L 27/18* (2013.01); *H01L 39/045* (2013.01)

(58) Field of Classification Search
None
See application file for complete search history.

(56) References Cited

U.S. PATENT DOCUMENTS

| 10,516,248 B1 * | 12/2019 | Taylor | H01L 39/2496 |
| 10,840,295 B2 * | 11/2020 | Sandberg | H01L 27/18 |
| 2015/0179916 A1 * | 6/2015 | Pramanik | C23C 14/083 |
| | | | 505/190 |
| 2015/0179918 A1 * | 6/2015 | Greer | H01L 39/2493 |
| | | | 204/192.32 |
| 2018/0247974 A1 * | 8/2018 | Oliver | H01L 39/045 |
| 2019/0206602 A1 * | 7/2019 | Sasaki | H01L 43/02 |

OTHER PUBLICATIONS

Ganesh (A Review on Magnesium Aluminate (MgAl2O4) Spinel: Synthesis, Processing and Applications), 2013 (Year: 2013).*
Lordi, "Emerging Materials for Quantum Information Symposium First Principles Atomistic Modeling of Decoherence Sources in Qubit Devices", Apr. 23, 2019, Abstract Only, 1 page.
Zeng et al., "Direct Observation of the Thickness Distribution of Ultra Thin $AIO_x$ Barrier in $Al/AlO_x/Al$ Josephson Junctions", Journal of Physics D: Applied Physics, vol. 48, No. 39, 5 pages.
Lin et al, Effects of Substrate Orientation on Aluminum Grown on MgAl2O4 Spinel Using Molecular Bean Epitaxy, Journal of Crystal Growth, vol. 314, 2011, pp. 298-301.
Muller et al, "Towards Understanding Two-Level-Systems in Amorphous Solids—Insights from Quantum Circuits", arXiv:1705v2, Jul. 24, 2018, 34 pages.
Schweinfest et al, "Atomistic and Electronic Structure of Al/MgAl2O4 and Ag/MgAl2O4 interfaces", Philosophical Magazine A, 2001, vol. 81, No. 4, pp. 927-955.

* cited by examiner

*Primary Examiner* — Khaja Ahmad
(74) *Attorney, Agent, or Firm* — Dority & Manning, P.A.

(57) ABSTRACT

Superconducting tunnel junctions for use in, for instance, quantum processors. In one example, a quantum processor can have at least one qubit structure. The at least one qubit structure includes a first aluminum layer, a second aluminum layer, and a crystalline dielectric layer disposed between the first aluminum layer and the second aluminum layer. The crystalline dielectric layer includes a spinel crystal structure.

20 Claims, 8 Drawing Sheets

SPINEL SUPERCONDUCTING TUNNEL JUNCTION FOR QUANTUM DEVICES

FIELD

The present disclosure relates generally to quantum computing systems, and more particularly to quantum devices having superconducting tunnel junctions with a spinel crystalline dielectric layer as a tunnel barrier layer.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b |1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a quantum processor having at least one qubit structure. The at least one qubit structure includes a first aluminum layer, a second aluminum layer, and a crystalline dielectric layer disposed between the first aluminum layer and the second aluminum layer. The crystalline dielectric layer includes a spinel crystal structure.

Other aspects of the present disclosure are directed to various systems, methods, apparatuses, and devices associated with superconducting tunnel junctions having a crystalline dielectric layer with a spinel crystal structure.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
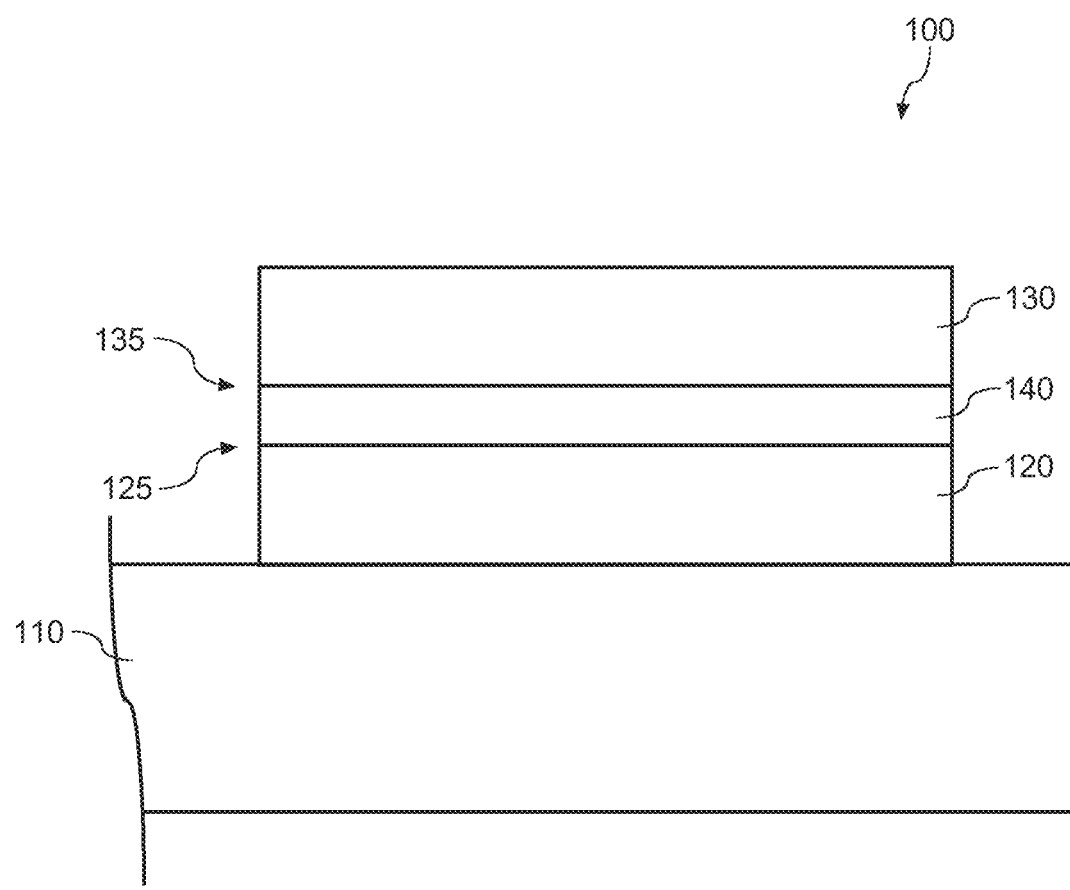
FIG. 1 depicts a portion of a superconducting tunnel junction according to example aspects of the present disclosure.

Example aspects of the present disclosure are directed to superconducting quantum computing devices, such as superconducting qubits. Certain superconducting qubits, such as transmon qubits, can include superconducting tunnel junction(s) with layers of superconductor and dielectric. The superconducting tunnel junction can be a type of Josephson junction. Anomalies in interfaces in the superconducting tunnel junction can produce, for instance, two-level-systems that limit the coherence of qubits in quantum computing devices (e.g., quantum processors). According to example aspects of the present disclosure, interfaces within a superconducting tunnel junction can be provided with reduced anomalies using a dielectric crystalline layer having a spinel crystal structure as a dielectric layer of the superconducting tunnel junction. In some embodiments, the spinel crystal structure can be $MgAl_2O_4$.

As used herein "spinel crystal structure" refers to a crystal structure having a spinel structure. A spinel structure can include cubic close-packed oxides with eight tetrahedral and four octahedral sites per unit. "Spinel crystal structure" can encompass any material, typically within a spinel group. One example material that can form a spinel crystal structure is $MgAl_2O_4$, which can also be referred to as "spinel." As used herein, "spinel crystal structure" refers to the structure of the crystal, not to the material "spinel."

Superconducting qubits can include non-linear inductive element(s) formed by a superconducting tunnel junction. The superconducting tunnel junction can be a tri-layer device that includes a layer of dielectric insulator sandwiched between layers of superconductor to form a superconductor-insulator-superconductor (SIS) junction. The superconducting tunnel junction can function as a Josephson junction for various quantum device applications.

Superconducting tunnel junctions can include layers of aluminum superconductor with an $Al_2O_3$ dielectric layer. This junction can be useful for at least the reason that aluminum forms a native $Al_2O_3$ oxide when exposed to oxygen. The native oxide can be self-limiting in that the oxide layer can resist the transport of additional oxygen to the metal interface. The native oxide layer can be conformal to the superconducting aluminum surface. Compared to other native oxides, the $Al_2O_3$ oxide is relatively free of pin holes that can introduce electrical shorts in the superconducting tunnel junction.

Superconducting tunnel junctions having an $Al_2O_3$ oxide layer as the dielectric layer, however, can suffer from several disadvantages. For instance, the $Al_2O_3$ oxide layer is amorphous rather than crystalline. This can result in defects that reduce or degrade a coherence time of qubits having these junctions. At the interface between the superconducting aluminum and the $Al_2O_3$ oxide layer, the aluminum atoms in the oxide layer have lower oxygen coordination than aluminum atoms several atomic layers further into the oxide layer. This can produce additional dipole-active defects that can reduce coherence time of qubits having these junctions. Reduction in coherence time can limit the quantum circuit depth of quantum devices having qubits formed from these junctions.

According to example aspects of the present disclosure, a quantum device, such as a quantum processor, can include a qubit structure. The qubit structure can include a superconducting tunnel junction. The superconducting tunnel junction can function as a Josephson junction. The superconducting tunnel junction can include a first superconducting aluminum layer and a second superconducting aluminum layer. A crystalline dielectric layer can be disposed between the first superconducting aluminum layer and the second superconducting aluminum layer. The crystalline dielectric layer can include a spinel crystal structure. In some embodiments, the spinel crystal structure can be $MgAl_2O_4$.

It has been shown that coherent interfaces can be provided between the superconducting aluminum layer and a crystalline dielectric layer having spinel crystal structure (e.g., $MgAl_2O_4$). (See Schweinfest et al., Atomistic and Electronic Structure of Al/$MgAl_2O_4$ and Ag/$Al_2O_4$ interfaces, Philosophical Magazine A, 2001, Vol. 81, No. 4, 927-955; Lin et al., Effects of Substrate Orientation on Aluminum Grown on $MgAl_2O_4$ Spinel using Molecular Beam Epitaxy, Journal of Crystal Growth 314 (2011), 298-301). A coherent interface occurs when crystal lattices are continuous across the interface. In that regard, a superconducting tunnel junction according to example aspects of the present disclosure can include a first interface between the first aluminum layer and the crystalline dielectric layer. The first interface can be a coherent interface. The superconducting tunnel junction can include a second interface between the second aluminum layer and the crystalline dielectric layer. The second interface can be a coherent interface.

According to example aspects of the present disclosure, the first aluminum layer can include one or more grains at the interface between the first aluminum layer and the crystalline dielectric layer. At least one of the grains can have a face centered cubic crystal structure. The crystalline dielectric layer can include one or more grains at the interface between the first aluminum layer and the crystalline dielectric layer. At least one grain of the crystalline dielectric layer is disposed in a cube-on-cube relationship with at least one grain of the first aluminum layer. Further, in some embodiments, the second aluminum layer can include one or more grains at the interface between the crystalline dielectric layer and the second aluminum layer. At least one of the grains can have a face centered cubic crystal structure. At least one grain of the second aluminum layer can be disposed in a cube-on-cube relationship with at least one grain of the crystalline dielectric layer.

In some embodiments, the first aluminum layer can be formed by epitaxial growth on a substrate (e.g., silicon substrate) such that the first aluminum layer is an epitaxial layer. The crystalline dielectric layer containing the spinel crystal structure can be formed by epitaxial growth on the first aluminum superconducting layer such that the crystalline dielectric layer is an epitaxial layer. The second aluminum layer can be formed by epitaxial growth on the crystalline dielectric layer such that the second aluminum layer is an epitaxial layer. In this way, the tri-layer structure forming the superconducting tunnel junction can be epitaxially grown on a substrate to form at least a portion of a qubit structure for a quantum device, such as a quantum processor.

As mentioned, the superconducting tunnel junction can be formed on a substrate. In some embodiments, the substrate is a silicon substrate to provide a low loss dielectric substrate. Other suitable substrates can be used without deviating from the scope of the present disclosure. For instance, the substrate can be sapphire (e.g., r-plane sapphire). In some embodiments, the substrate can be a single crystal of $MgAl_2O_4$. An orientation associated with the substrate can be (100) to reduce the formation of twin boundary defects during crystal formation.

In some embodiments, a buffer layer can be disposed between the substrate and the first superconducting aluminum layer of the superconducting tunnel junction. The buffer layer can be, for instance, a layer of $MgAl_2O_4$, such as an epitaxial layer of $MgAl_2O_4$. Similar to the substrate, an orientation of the buffer layer can be (100) to reduce twin boundary defects.

Example aspects of the present disclosure are directed to a method of forming a superconducting tunnel junction having a crystalline dielectric layer including a spinel crystal structure. The method can include forming a first aluminum layer on a substrate. As discussed above, the substrate can be for instance, silicon, sapphire, $MgAl_2O_4$ or other suitable substrate. In some embodiments, the first aluminum layer can be formed by epitaxial growth of the first aluminum layer on the substrate.

The method can include forming a crystalline dielectric layer having a spinel crystal structure on the first aluminum layer. For instance, a crystalline dielectric layer including $MgAl_2O_4$ can be epitaxially formed (e.g., epitaxial growth) on the first aluminum layer such that the crystalline dielectric layer is an epitaxial layer. The second aluminum layer can be epitaxially formed on the crystalline dielectric layer (e.g., using epitaxial grown). In some embodiments, an oxide removal process can be implemented on the first aluminum layer prior to formation of the crystalline dielectric layer to ensure a clean surface for epitaxial growth and to provide for a coherent interface between the first aluminum layer and the crystalline dielectric layer.

Various methods of epitaxial growth and/or film deposition can be used to form the dielectric crystal layer without deviating from the scope of the present disclosure. For instance, the growth of the dielectric crystal layer on the first aluminum layer can be accomplished using sputter techniques, molecular-beam epitaxy (MBE), chemical vapor deposition (CVD), or thermal evaporation. Similarly, the epitaxial growth of the first aluminum layer and/or the second aluminum layer can be accomplished using sputter techniques, molecular-beam epitaxy (MBE), chemical vapor deposition (CVD), or thermal evaporation. In some embodiments, the crystalline dielectric layer including $MgAl_2O_4$ can be formed on the first aluminum layer using a chemical reaction of gaseous oxygen with one or more elemental metals (e.g. Mg). Elemental metals can include an alloy or two or more elemental metals, such as an alloy of Al and Mg.

In some embodiments, the substrate can include a buffer layer (e.g., $MgAl_2O_4$). The buffer layer can improve the interface between the first aluminum layer and the substrate. In some embodiments, the buffer layer can be epitaxially formed on the silicon substrate using, for instance, sputter techniques, molecular-beam epitaxy (MBE), chemical vapor deposition (CVD), or thermal evaporation.

Aspects of the present disclosure provide a number of technical effects and benefits. For instance, a superconducting tunnel junction with a crystalline dielectric structure according to example embodiments of the present disclosure can have reduced defects at an interface between the superconducting aluminum layers and the crystalline dielectric structure. The reduced defects can improve the coherence of quantum devices (e.g., quantum processors) having qubit structures using these superconducting tunnel junctions, increasing the quantum computing capability (e.g., quantum circuit depth) of quantum devices. Moreover, use of a crystalline dielectric layer having a spinel crystal structure (e.g., $MgAl_2O_4$) can provide many similar properties as $Al_2O_3$ dielectric layers. For instance, a crystalline dielectric layer having a spinel crystal structure (e.g., $MgAl_2O_4$) is a highly ionic solid with similar band gap and heats of formation as $Al_2O_3$.

With reference now to the FIGS., example embodiments of the present disclosure will be discussed in further detail. As used here, the use of the term "about" in conjunction with a value refers to within 20% of the value.

FIG. 1 depicts a cross-sectional view of a superconducting tunnel junction 100 disposed on a substrate 110 according to example embodiments of the present disclosure. The superconducting tunnel junction 100 can function, for instance, as a Josephson junction in a qubit structure of a quantum device. The superconducting tunnel junction 100 can include a first superconducting layer 120 and a second superconducting layer 130 separated by a dielectric layer 140 disposed between the first superconducting layer 120 and the second superconducting layer 130. The dielectric layer 140 can serve as an insulating layer or a "tunnel barrier layer" of the superconducting tunnel junction 100.

The first superconducting layer 120, the dielectric layer 140, and the second superconducting layer 130 form a superconductor-insulator-superconductor (SIS) tunnel junction. Current passes through the superconducting tunnel junction 100 through a process of quantum tunneling. The superconducting tunnel junction 100 can be used, for instance, as part of a qubit structure (e.g., charge qubit, flux qubit, phase qubit) of a quantum device (e.g. quantum processor), superconducting quantum interference device (SQUID), or for other applications.

According to example aspects of the present disclosure, the first superconducting layer 120 is an aluminum superconducting layer. The second superconducting layer 130 is an aluminum superconducting layer. The dielectric layer 140 is a crystalline dielectric layer having a spinel crystal structure (e.g., $MgAl_2O_4$ crystal structure). The superconducting tunnel junction 100 has a first interface 125 between the first superconducting layer 120 and the dielectric layer 140. The superconducting tunnel junction 100 has a second interface 135 between the dielectric layer 140 and the second superconducting layer 130. According to example aspects of the present disclosure, the properties associated with using a crystalline dielectric layer having a spinel crystal structure can reduce anomalies at the interface 125 and at the interface 135 of the superconducting tunnel junction 100. This can lead to increase coherence of quantum devices incorporating the superconducting tunnel junction 100.

Figure 2:
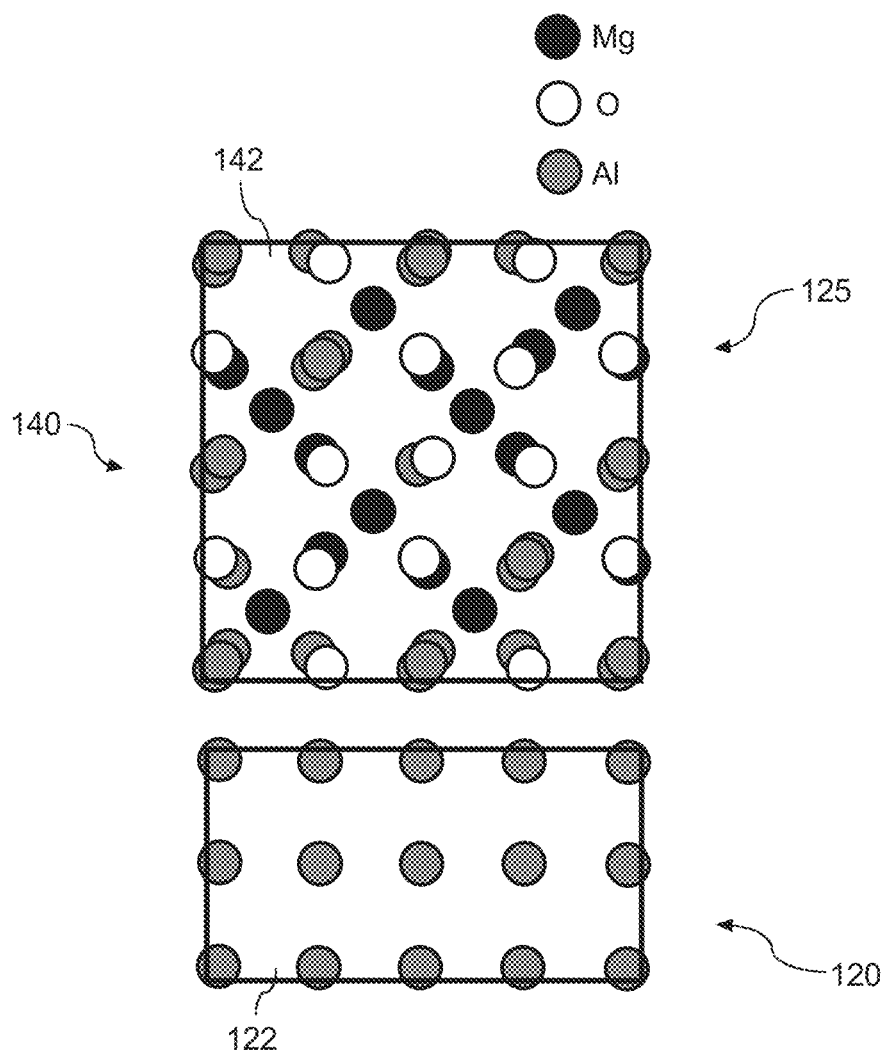
FIG. 2 depicts an example coherent interface in a superconducting tunnel junction according to example aspects of the present disclosure.

More particularly, FIG. 2 depicts a portion of the interface 125 between the aluminum first superconducting layer 120 and the crystalline dielectric layer 140 having a spinel crystal structure. As shown, the aluminum of the first superconducting layer 120 has a crystal lattice structure. The crystalline dielectric layer 140 having the spinel crystal structure (e.g., $MgAl_2O_4$) also has a crystal lattice structure. The interface 125 between the first superconducting layer 120 and the crystalline dielectric layer 140 is a coherent interface. More particularly, although the crystal structures of the aluminum and dielectric may be different, the lattice structure of the aluminum first superconducting layer 120 is continuous across the interface 125 into the lattice structure of the spinel crystal structure (e.g., $MgAl_2O_4$) and vice versa. In some embodiments, a lattice constant associated with the crystalline dielectric layer 140 can be within 10% of a lattice constant associated with the aluminum first superconducting layer 120, such as within 5% of a lattice constant associated with the aluminum first superconducting layer 120.

Coherent interfaces between superconducting aluminum and $MgAl_2O_4$ have been demonstrated. (See Schweinfest et al., Atomistic and Electronic Structure of Al/$MgAl_2O_4$ and Ag/$Al_2O_4$ interfaces, Philosophical Magazine A, 2001, Vol. 81, No. 4, 927-955; Lin et al., Effects of Substrate Orientation on Aluminum Grown on $MgAl_2O_4$ Spinel using Molecular Beam Epitaxy, Journal of Crystal Growth 314 (2011), 298-301).

The aluminum first superconducting layer 120 can include a grain. In FIG. 2, the grain of the first superconducting layer 120 is represented as having a face-centered cubic crystal structure 122. The crystalline dielectric layer 140 can include a grain. In FIG. 2, the grain of the crystalline dielectric layer 140 is represented as having cubic spinel structure 142. The grain of the crystalline dielectric layer 140 can be disposed in a cube-on-cube relationship (e.g., cube-on-cube epitaxial relationship) with the grain of the first superconducting layer 120.

Figure 3:
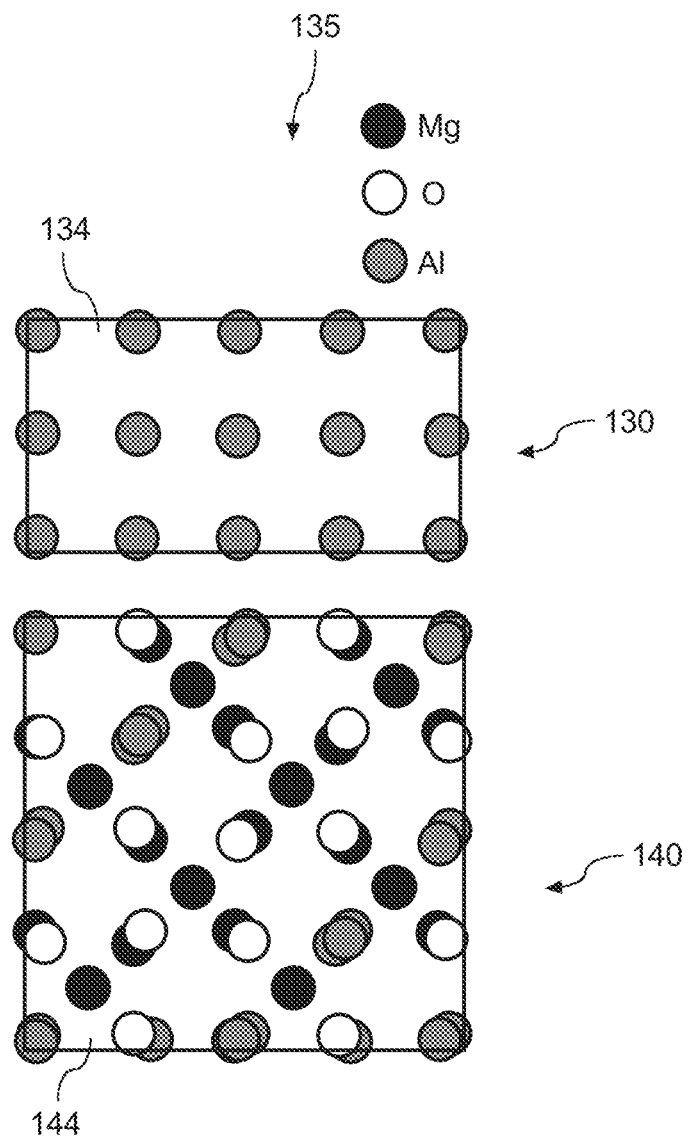
FIG. 3 depicts an example coherent interface in a superconducting tunnel junction according to example aspects of the present disclosure.

FIG. 3 depicts a portion of the interface 135 between the aluminum second superconducting layer 120 and the crystalline dielectric layer 140. The crystalline dielectric layer 140 has a spinel crystal lattice structure. As shown, the aluminum of the second superconducting layer 130 has a crystal lattice structure. The interface 135 between the second superconducting layer 130 and the crystalline dielectric layer 140 is a coherent interface. More particularly, the lattice structure of the spinel crystalline dielectric layer 140 (e.g., $MgAl_2O_4$) is continuous across the interface 135 into the lattice structure of the aluminum second superconducting layer 130 and vice versa. In some embodiments, a lattice constant associated with the crystalline dielectric layer 140 can be within 10% of a lattice constant associated with the aluminum second superconducting layer 130, such as within 5% of a lattice constant associated with the aluminum second superconducting layer 130.

The crystalline dielectric layer 140 can include a grain. In FIG. 3, the grain of the crystalline dielectric layer 140 is represented as having the spinel crystal structure 144. The aluminum second superconducting layer 130 can include a grain. In FIG. 3, the grain of the second superconducting layer 130 is represented as having a face-centered cubic crystal structure 134. The grain of the second superconducting layer 130 can be disposed in a cube-on-cube relationship (e.g., cube-on-cube epitaxial relationship) with the grain of the crystalline dielectric layer 140.

Referring to FIG. 1, the superconducting tunnel junction 100 can be disposed on a substrate 110. In some embodiments, the substrate 110 is a silicon substrate to provide a low loss dielectric. Other suitable substrates can be used without deviating from the scope of the present disclosure. An orientation associated with the silicon substrate can be (100). This can reduce twin boundary defects in the superconducting tunnel junction 100.

Figure 4:
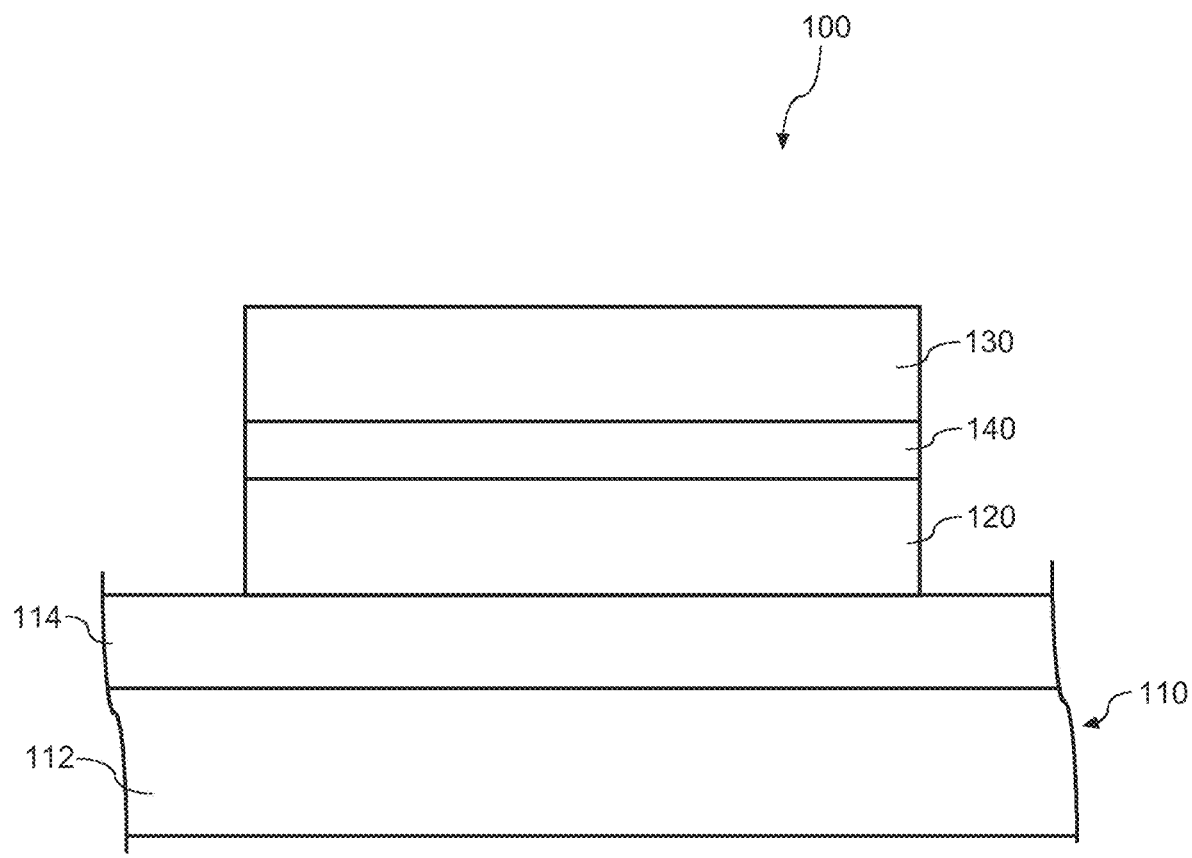
FIG. 4 depicts a superconducting tunnel junction disposed on a substrate according to example embodiments of the present disclosure.

For instance, as shown in FIG. 4, the substrate 110 can include a buffer layer 114. The buffer layer 114 can be, for instance, an $MgAl_2O_4$ layer. The $MgAl_2O_4$ buffer layer 114 can be epitaxially formed on a silicon layer 112 or other layer of the substrate 110 such that the buffer layer 114 is an epitaxial layer. An orientation associated with the buffer layer 114 can be (100). This can reduce twin boundary defects in the superconducting tunnel junction 100.

Other suitable substrates can be used without deviating from the scope of the present disclosure. For instance, the substrate 110 can be sapphire (e.g., r-plane sapphire). In some embodiments, the substrate 110 can be single crystal $MgAl_2O_4$.

Figure 5:
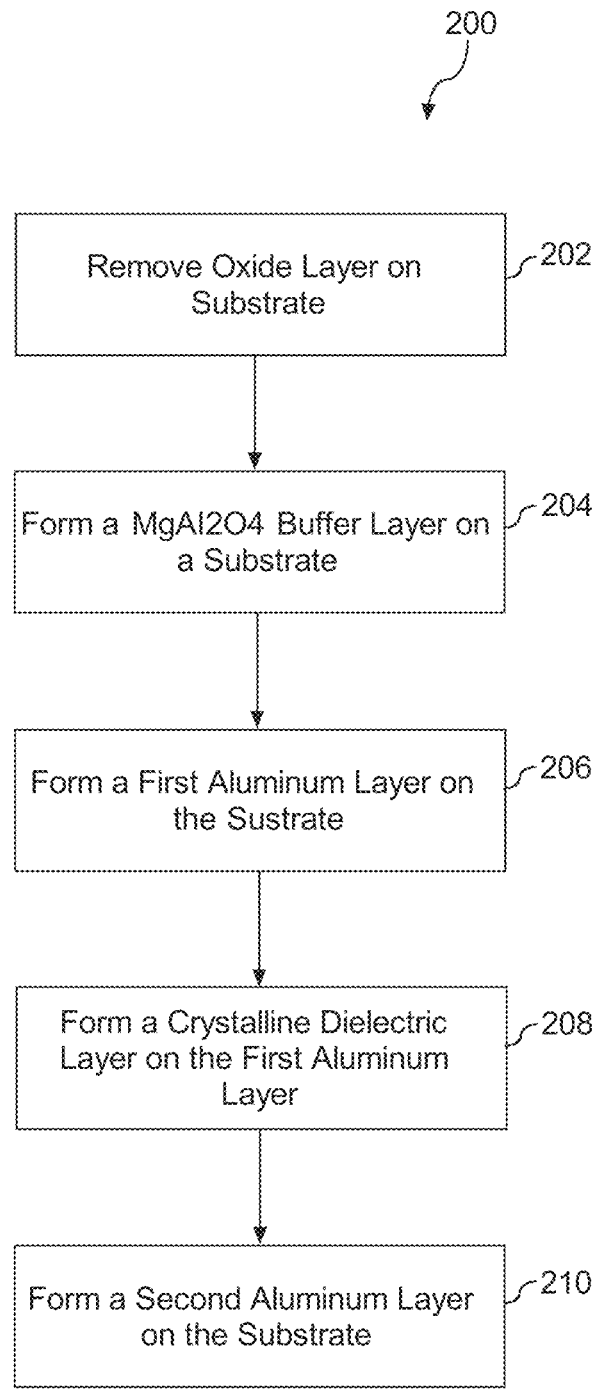
FIG. 5 depicts an example process for forming a superconducting tunnel junction according to example embodiments of the present disclosure.

FIG. 5 depicts a flow diagram of an example method (200) according to example embodiments of the present disclosure. The method (200) illustrates steps performed in a particular order for purposes of illustration and discussion. Those of ordinary skill in the art, using the disclosures provided herein, will understand that various steps of any of the methods described herein can be adapted, modified, rearranged, omitted, include steps not illustrated, and/or expanded in various ways without deviating from the scope of the present disclosure.

At (202), the method can optionally include removing an oxide layer from a substrate (e.g., using an oxidation removal process). Removing the oxide layer from the substrate (e.g., a silicon substrate) can provide a clean surface for epitaxial growth of superconducting layers and/or $MgAl_2O_4$ crystal layers. Ensuring that surfaces of the substrate and/or other layers of the superconducting tunnel junction are free of oxide can reduce the presence of anomalies at an interface in the superconducting tunnel junction.

At (204), the method can optionally include forming a $MgAl_2O_4$ buffer layer on the substrate. For instance, as discussed with reference to FIG. 4, an $MgAl_2O_4$ buffer layer 114 can be formed (e.g., by epitaxial growth) on a silicon layer 112 to provide a substrate 110 for the superconducting tunnel junction 100. The $MgAl_2O_4$ buffer layer can be epitaxially formed such that the $MgAl_2O_4$ buffer layer is an epitaxial layer. In some embodiments, the $MgAl_2O_4$ buffer layer can be associated with a (100) orientation.

The $MgAl_2O_4$ buffer layer can be formed using thin film deposition. For instance, the first superconducting layer can be formed (e.g., epitaxially grown) using sputter techniques, molecular-beam epitaxy (MBE), chemical vapor deposition (CVD), or thermal evaporation. Other deposition techniques can be used without deviating from the scope of the present disclosure.

At (206), the method can include forming a first superconducting layer on the substrate. The first superconducting layer can be an aluminum superconducting layer. In some embodiments, the first superconducting layer can be epitaxially formed on the substrate such that the first superconducting layer is an epitaxial layer. The first superconducting layer can be formed using thin film deposition. For instance, the first superconducting layer can be formed (e.g., epitaxially grown) using sputter techniques, molecular-beam epitaxy (MBE), chemical vapor deposition (CVD), or thermal evaporation. Other deposition techniques can be used without deviating from the scope of the present disclosure.

At (208), the method can include forming a crystalline dielectric layer having a spinel crystal structure on the first superconducting layer. The crystalline dielectric layer can be $MgAl_2O_4$. In some embodiments, the crystalline dielectric layer can be epitaxially formed on the first superconducting layer such that the crystalline dielectric layer is an epitaxial layer. The crystalline dielectric layer can be formed using thin film deposition. For instance, the crystalline dielectric layer can be formed (e.g., epitaxially grown) using sputter techniques, molecular-beam epitaxy (MBE), chemical vapor deposition (CVD), or thermal evaporation. Other deposition techniques can be used without deviating from the scope of the present disclosure. For instance, the crystalline dielectric layer can be formed via a chemical reaction of gaseous oxygen (e.g., $O_2$) with an elemental metal (e.g., Al, Mg, etc.).

At (210), the method can include forming a second superconducting layer on the substrate. The first superconducting layer can be an aluminum superconducting layer or other superconducting layer. In some embodiments, the second superconducting layer can be epitaxially formed on the substrate such that the first superconducting layer is an epitaxial layer. The aluminum superconducting layer can be formed using thin film deposition. For instance, the first superconducting layer can be formed (e.g., epitaxially grown) using sputter techniques, molecular-beam epitaxy (MBE), chemical vapor deposition (CVD), or thermal evaporation. Other deposition techniques can be used without deviating from the scope of the present disclosure.

Figure 6:
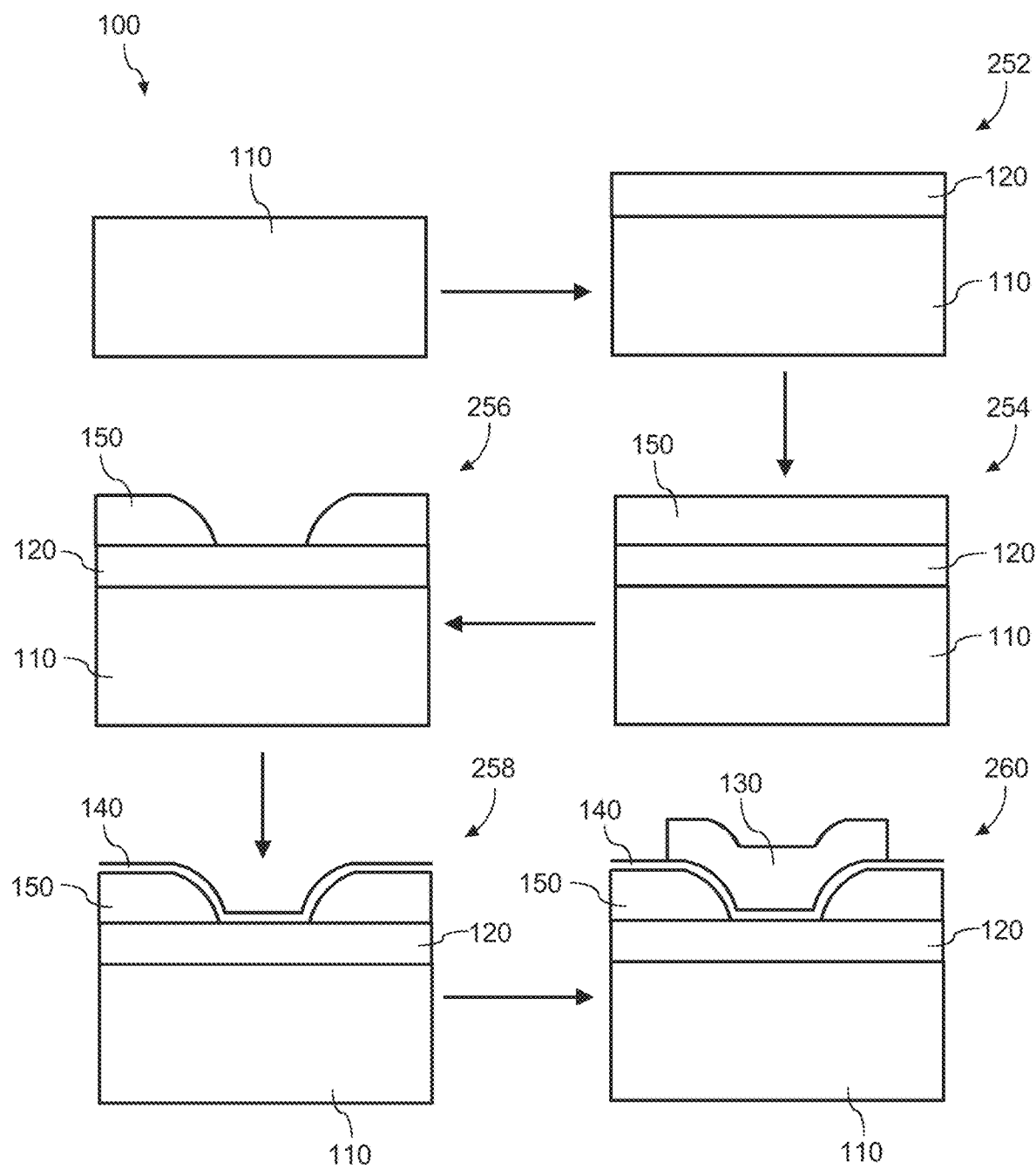
FIG. 6 depicts an example process for forming a superconducting tunnel junction according to example embodiments of the present disclosure.

The tri-layer structure of the superconducting tunnel junction according to example aspects of the present disclosure can be completely formed epitaxially on a substrate. More particularly, FIG. 6 depicts epitaxial formation of a superconducting tunnel junction on a substrate according to example aspects of the present disclosure. In some embodiments, the superconductor tunnel junction can be formed using a junction in via process.

For instance, at (252), the first superconducting layer 120 is epitaxially formed on the substrate 110. At (254), a dielectric layer 150 can be formed on the first superconducting layer 120. The dielectric layer 150 can be, for instance, $SiO_2$. The dielectric layer 150 can be formed, for instance, using a deposition process and/or oxidation process. At (256), a via structure or trench structure can be formed in the dielectric layer 150. The via structure or trench structure can be formed using a patterning/lithography process, such as a etch process (e.g., wet chemical etch, plasma dry etch, etc.). At (258), the crystalline dielectric layer 140 having the spinel crystal structure is epitaxially formed on the first superconducting layer 120 in the via structure. At (260), the second superconducting layer 130 is epitaxially formed on the crystalline dielectric layer 140.

Figure 7:
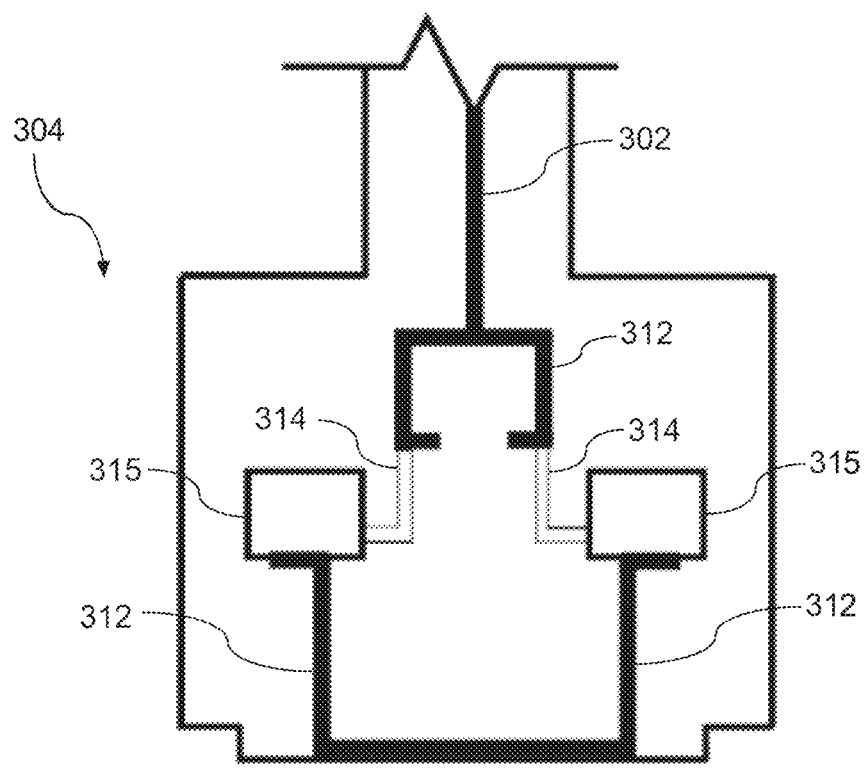
FIG. 7 depicts an example qubit structure having a superconducting tunnel junction according to example embodiments of the present disclosure.

FIG. 7 depicts a portion of an example qubit structure employing a superconducting tunnel junction according to example aspects of the present disclosure as a Josephson junction. FIG. 7 illustrates one example qubit structure for purposes of illustration and discussion. Those of ordinary skill in the art, using the disclosures provided herein, will understand that superconducting tunnel junctions according to example embodiments of the present disclosure can be used other qubit structures or configurations without deviating from the scope of the present disclosure.

FIG. 7 depicts a close-up view of a portion of a qubit structure having a DC-SQUID 304 coupled to waveguide 302. DC-SQUID 304 includes a loop 312 of superconducting material that is interrupted by two Josephson junctions 314, each of which can be formed using a superconducting tunnel junction according to example aspects of the present disclosure. For example, the Josephson junctions 314 may be formed from a tri-layer of $Al/MgAl_2O_4/Al$ thin films. Thus, the Josephson junctions 314 are coupled in parallel with one another, with a first common node in electrical contact with the waveguide 302 and a second common node in electrical contact with a ground plane. The Josephson junctions 314 are electrically connected to the loop 312 through contact pads 315 that may be formed from the same or different superconducting material as the loop 312. In some implementations, the contact pads 315 are absent and the Josephson junctions 314 are in direct physical and electrical contact with the loop 312. The thickness of the loop 312, contact pads 315 and Josephson junctions may be between tens and thousands of nanometers, e.g., on the order of 100 to 200 nm. Each of waveguide 302, DC-SQUID 304, and ground plane may be formed from materials exhibiting superconducting properties at or below a superconducting critical temperature, such as aluminum (superconducting critical temperature of 1.2 kelvin) or niobium (superconducting critical temperature of 9.3 kelvin). The substrate on which the waveguide 302, DC-SQUID 304 and ground-plane are formed includes a dielectric material such as, e.g., sapphire, $SiO_2$ or silicon. In some implementations, sapphire provides an advantage of low dielectric loss, thus leading to higher decoherence times.

Figure 8:
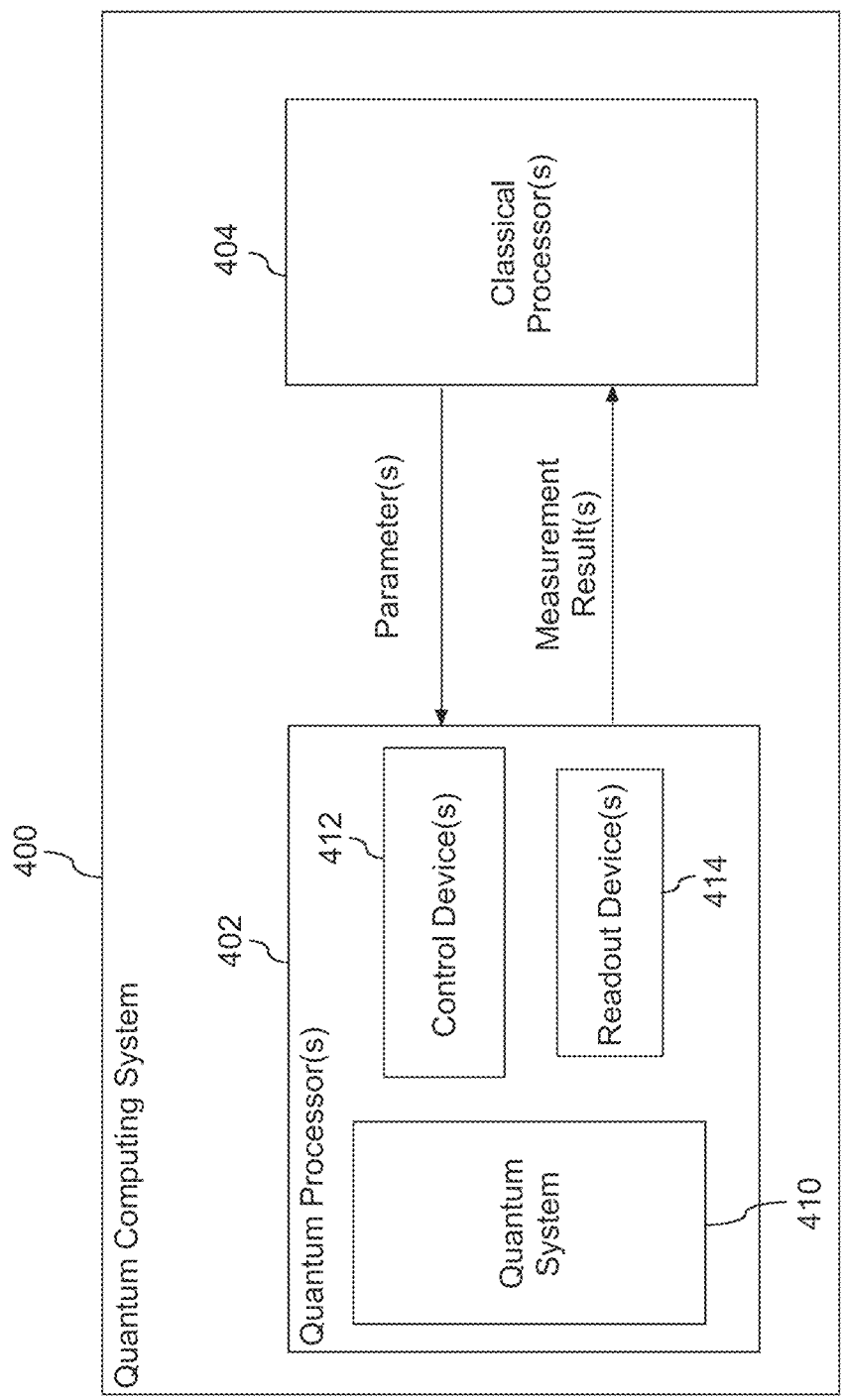
FIG. 8 depicts a quantum computing system according to example embodiments of the present disclosure.

FIG. 8 depicts an example quantum computing system 400. The example system 400 is an example of system on one or more classical computers or quantum computing devices in one or more locations, in which the superconducting tunnel junction 100 according to example aspects of the present disclosure can be implemented. Those of ordinary skill in the art, using the disclosures provided herein, will understand that the superconducting tunnel junction can be implemented in other quantum computing structures or systems and/or for other applications without deviating from the scope of the present disclosure.

The system 400 includes quantum processor(s) 402 in data communication with one or more classical processors 404. The quantum processor(s) 402 includes components for performing quantum computation. For example, the quantum processor(s) 402 includes a quantum system 410, control device(s) 412, and readout device(s) 414 (e.g., readout resonator(s)). The quantum system 410 can include one or more multi-level quantum subsystems, such as a register of qubits. In some implementations, the multi-level quantum subsystems can include superconducting qubits, such as flux qubits, charge qubits, transmon qubits, gmon qubits, etc. The superconducting qubits can include one or more superconducting tunnel junctions according to example aspects of the present disclosure.

Quantum circuits may be constructed and applied to the register of qubits included in the quantum system 410 via multiple control lines that are coupled to one or more control devices 412. Example control devices 412 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 412 may be configured to operate on the quantum system 410 through one or more respective control parameters (e.g., one or more physical control parameters). For example, in some implementations, the multi-level quantum subsystems may be superconducting qubits and the control devices 412 may be configured to provide control pulses to control lines to generate magnetic fields to adjust the frequency of the qubits.

The quantum hardware 402 may further include readout devices 414 (e.g., readout resonators). Measurement results 408 obtained via measurement devices may be provided to the classical processors 404 for processing and analyzing. In some implementations, the quantum processor(s) 402 may include a quantum circuit and the control device(s) 412 and readout devices(s) 414 may implement one or more quantum logic gates that operate on the quantum system 402 through physical control parameters (e.g., microwave pulses) that are sent through wires included in the quantum processor(s) 402. Further examples of control devices include arbitrary waveform generators, wherein a DAC (digital to analog converter) creates the signal.

The readout device(s) 414 may be configured to perform quantum measurements on the quantum system 410 and send measurement results 408 to the classical processors 404. In addition, the quantum hardware 402 may be configured to receive data specifying physical control qubit parameter values 406 from the classical processors 404. The quantum hardware 402 may use the received physical control qubit parameter values 406 to update the action of the control device(s) 412 and readout devices(s) 414 on the quantum system 410. For example, the quantum processor(s) 402 may receive data specifying new values representing voltage strengths of one or more DACs included in the control devices 412 and may update the action of the DACs on the quantum system 410 accordingly. The classical processors 404 may be configured to initialize the quantum system 410 in an initial quantum state, e.g., by sending data to the quantum processor(s) 402 specifying an initial set of parameters.

The readout device(s) 414 can take advantage of a difference in the impedance for the |0> and |1> states of an element of the quantum system, such as a qubit, to measure the state of the element (e.g., the qubit). For example, the resonance frequency of a readout resonator can take on different values when a qubit is in the state |0> or the state |1>, due to the nonlinearity of the qubit. Therefore, a microwave pulse reflected from the readout device 414 carries an amplitude and phase shift that depend on the qubit state. In some implementations, a Purcell filter can be used in conjunction with the readout device(s) 414 to impede microwave propagation at the qubit frequency.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A quantum processor comprising:
a qubit structure comprising a superconducting tunnel junction that includes:
a first superconducting layer with a first crystal structure;
a second superconducting layer with a second crystal structure; and
a tunnel barrier layer disposed between the first superconducting layer and the second superconducting layer, the tunnel barrier layer comprising a spinel crystal structure that is continuous with the first crystal structure at a first interface and with the second crystal structure at a second interface, wherein the first interface is between the first superconducting layer and the tunnel barrier layer and the second interface is between the second superconducting layer and the tunnel barrier layer.

2. The quantum processor of claim 1, wherein the spinel crystal structure comprises $MgAl_2O_4$.

3. The quantum processor of claim 1, wherein the first superconducting layer and the second superconducting layer are are crystalline aluminum layers that sandwich the tunnel barrier layer to form the superconducting tunnel junction.

4. The quantum processor of claim 1, wherein the first interface that is between the first superconducting layer and the tunnel barrier layer is a coherent interface.

5. The quantum processor of claim 1, wherein the second interface that is between the second superconducting layer and the tunnel barrier layer is a coherent interface.

6. The quantum processor of claim 1, wherein the first superconducting layer comprises one or more grains, at least one grain having a face centered cubic crystal structure, wherein the tunnel barrier layer comprises one or more grains, wherein at least one grain of the tunnel barrier layer is disposed in a cube-on-cube relationship with the at least one grain of the first superconducting layer.

7. The quantum processor of claim 1, wherein the second superconducting layer comprises one or more grains, at least one grain of the second superconducting layer being disposed in a cube-on-cube relationship with at least one grain of the tunnel barrier layer.

8. The quantum processor of claim 1, wherein the first superconducting layer is disposed on a substrate.

9. The quantum processor of claim 8, wherein the substrate is a silicon substrate.

10. The quantum processor of claim 8, wherein a buffer layer is disposed between the substrate and the first superconducting layer.

11. The quantum processor of claim 10, wherein the buffer layer comprises $MgAl_2O_4$.

12. The quantum processor of claim 10, wherein the buffer layer is an epitaxial layer.

13. A method of forming a superconducting tunnel junction to be used in a quantum device, the method comprising:
forming a first superconducting layer on a substrate, the first superconducting layer comprising aluminum;
growing an epitaxial crystalline layer having a spinel crystal structure on the first superconducting layer, wherein the epitaxial crystalline layer is comprised of an insulating material; and
forming a second superconducting layer on the epitaxial crystalline layer such that a tunnel barrier layer of the superconducting tunnel junction comprises the epitaxial crystalline layer.

14. The method of claim 13, wherein the substrate comprises a silicon layer and a buffer layer, the buffer layer comprising $MgAl_2O_4$, the buffer layer being an epitaxial layer.

15. The method of claim 13 further comprising:
forming an interface between the first superconducting layer and the epitaxial crystalline such that the epitaxial crystalline structure is continuous with a crystalline structure of the first superconducting layer.

16. The method of claim 13 further comprising:
forming a quantum processor that includes a qubit, wherein the qubit comprises the superconducting tunnel junction.

17. The method of claim 13, wherein the method comprises removing an oxide layer on the substrate prior to forming the first aluminum layer on the substrate.

18. A qubit structure for use in a quantum device, comprising:
a superconducting tunnel junction including:
a first superconducting layer;
a second superconducting layer;
an epitaxial tunnel barrier layer epitaxially grown on the first superconducting layer and sandwiched between the first superconducting layer and the second superconducting layer, the tunnel barrier layer comprising crystalline $MgAl_2O_4$.

19. The qubit structure of claim 18, wherein a lattice structure of the first superconducting layer is continuous with a spinel crystal structure of the epitaxial tunnel barrier layer.

20. The qubit structure of claim 18, wherein a lattice structure of the second superconducting layer is continuous with a spinel crystal structure of the epitaxial tunnel barrier layer.

* * * * *